United States Patent [19]

Moore

[11] Patent Number: 4,609,040
[45] Date of Patent: Sep. 2, 1986

[54] SELF-SECURING HEAT SINK

[75] Inventor: Marvin F. Moore, Carrollton, Tex.

[73] Assignee: Thermalloy Incorporated, Dallas, Tex.

[21] Appl. No.: 718,556

[22] Filed: Apr. 1, 1985

[51] Int. Cl.⁴ .......................................... H01L 23/40
[52] U.S. Cl. .............................. 165/80.3; 174/16 HS; 357/79; 357/81
[58] Field of Search .................. 165/80.3; 174/16 HS; 357/79, 81

[56] References Cited

U.S. PATENT DOCUMENTS

| | | | |
|---|---|---|---|
| 3,548,927 | 12/1970 | Spurling | 357/81 X |
| 3,558,994 | 1/1971 | Bernstein | 357/79 X |
| 3,670,215 | 6/1972 | Wilkens et al. | 174/16 HS |
| 4,054,901 | 10/1977 | Edwards et al. | 357/81 |
| 4,203,488 | 5/1980 | Johnson et al. | 174/16 HS |
| 4,215,361 | 7/1980 | McCarthy | 174/16 HS |
| 4,222,090 | 9/1980 | Jaffe | 165/80.3 |

OTHER PUBLICATIONS

IERC; A New Dissipator for Double Dip, CMOS, MOS-FET, and Microprocessor Packages, bulletin 186, 11/76.

Primary Examiner—Sheldon J. Richter
Attorney, Agent, or Firm—Kanz, Scherback & Timmons

[57] ABSTRACT

A self-securing heat sink for transistors and the like comprises a unitary member that is constructed from a malleable material having a high heat transfer coefficient. The unitary member includes a base portion, at least one heat radiating fin portion, and a clip portion that is capable of engaging a transistor to retain the heat sink securely on the transistor without necessitating the use of threaded fasteners, rivets, or the like.

8 Claims, 11 Drawing Figures

SELF-SECURING HEAT SINK

BACKGROUND OF THE INVENTION

This invention relates generally to heat sinks for use with transistors and the like. More particularly, but not by way of limitation, this invention relates to a self-securing heat sink wherein the heat sink is attached to a transistor or the like by the force exerted of a resilient clip located on the heat sink.

The most commonly used material for constructing heat sinks is aluminum or an aluminum alloy. Such materials are generally considered to be malleable and have little resilience but do have excellent heat transfer characteristics. The aluminum materials can be easily formed so that the heat sinks can be manufactured by mass production techniques and are, generally speaking, relatively inexpensive.

For the most part, the transistors to which heat sinks are ordinarily attached have a hole extending through a metal tab thereon. The hole is utilized to mount the heat sink on the transistor with a threaded fastener. In mass producing circuits utilizing transistors with heat sinks attached, the insertion of a threaded fastener to attach the heat sink to the transistor is a substantially manual operation. The production rate is slowed considerably thereby and, of course, is much more expensive since this is a labor-intensive process. Also, the threaded fasteners themselves are relatively expensive when considered in the volume of fasteners utilized in mass production of circuits.

Accordingly, it is an object of this invention to provide an improved heat sink which is self-securing on the transistor and thereby eliminates the necessity for attaching the heat sink to the transistor with a threaded fastener or the like.

SUMMARY OF THE INVENTION

This invention then provides a self-securing heat sink for transistors and the like. The heat sink comprises a unitary member constructed from a malleable material having a high heat transfer coefficient. The unitary member includes a base portion; at least one heat dissipating fin portion disposed at an angle to the base portion; and a clip portion extending from and reverse bent over the base portion in spaced relationship to the base portion for receiving the transistor. The clip portion includes a medial portion angled toward the base portion and has an elongated embossment therein for increasing the rigidity of the clip portion whereby the heat sink is retained on the transistor by the force of the clip portion holding the transistor against the base portion.

BRIEF DESCRIPTION OF THE DRAWING

The foregoing and additional objects and advantages of the invention will become more apparent as the following detailed description is read in conjunction with the accompanying drawing wherein like reference characters denote like parts in all views and wherein.

DESCRIPTION OF THE EMBODIMENT OF FIG. 1

Figure 2:
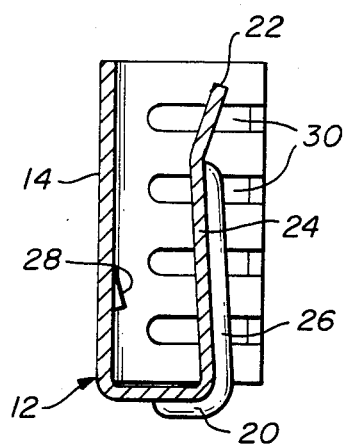
FIG. 2 is a cross-sectional view taken generally along line 2—2 of FIG. 1.
Figure 1:
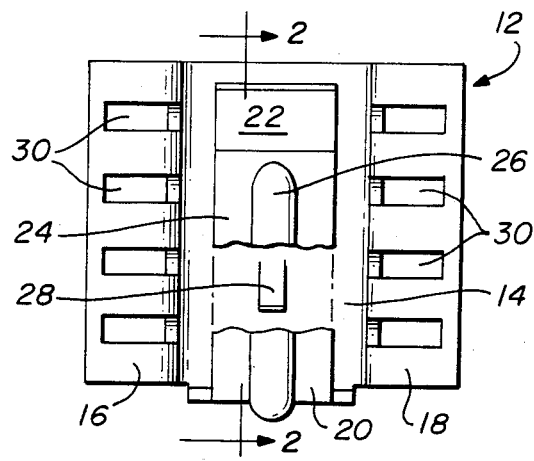
FIG. 1 is a top plan view, having a portion thereof broken away, of a heat sink constructed in accordance with the invention.
Figure 3:
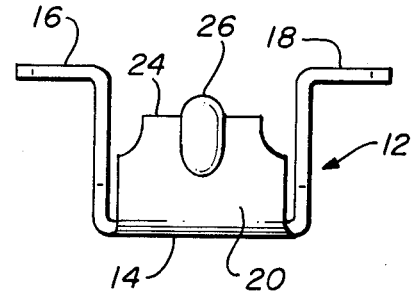
FIG. 3 is an end elevational view of the heat sink of FIG. 1.

Referring to the drawing and to FIGS. 1, 2 and 3 in particular, shown therein and generally designated by the reference character 12 is a self-securing heat sink constructed in accordance with the invention. The heat sink 12 is preferably constructed from aluminum or an aluminum alloy that has sufficent malleability to be formed into the illustrated configuration and while at the same time having a high heat transfer coefficient.

The heat sink 12 is constructed from a unitary member having a base portion 14 and upstanding radiating heat portions 16 and 18 disposed at an angle to the base portion 14. A clip portion 20, which can best be seen in FIG. 2, extends from the base portion 14 and is reverse bent over the base portion in spaced relationship to the base portion 14.

It will be noted that the clip portion 20 includes a free end portion 22 which is angled relatively away from the base portion 14 and a medial portion 24 angled toward the base portion 14. An elongated embossment 26 is formed on the medial portion 24 and extends generally from the free end portion 22 along the medial portion 24 through at least a portion of the reverse bent portion to increase the rigidity and resiliency of the clip portion 20.

A small embossment 28 is formed in the base portion 14 and projects toward the clip portion 20. The embossment 28 extends into a hole in a transistor (not shown) when assembled therewith. The embossment 28, in combination with the clip portion 20 and the base portion 14, functions to releaseably lock the transistor (not shown) securely in the heat sink 12.

Each of the fin portions 16 and 18 is provided with a plurality of spaced openings 30 to increase the efficiency of heat radiation of the heat sink 12. To conserve space and to provide a greater radiating area and stiffness to the heat sink 12, the fin portions 16 and 18 are bent at right angles as shown in FIG. 3.

When the heat sink 12 is placed on a transistor (not shown), the transistor is disposed between the clip portion 20 and the base portion 14 with the hole in the upper end of the transistor in engagement with the embossment 28. Normally, the heat sink 12 is disposed on a circuit board (not shown) in a position wherein the reverse bent part of the clip portion 20 will be located most remote from the circuit board. In other words, the view of FIG. 3 would be a top view of the heat sink 12 when positioned on a circuit board.

THE MODIFICATION OF FIGS. 4, 5 & 6

Figure 6:
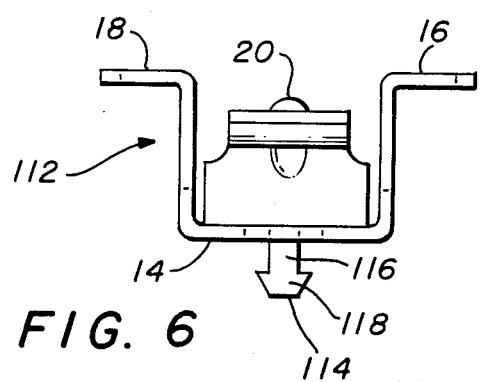
FIG. 6 is an end elevational view of the heat sink of FIG. 4.
Figure 4:
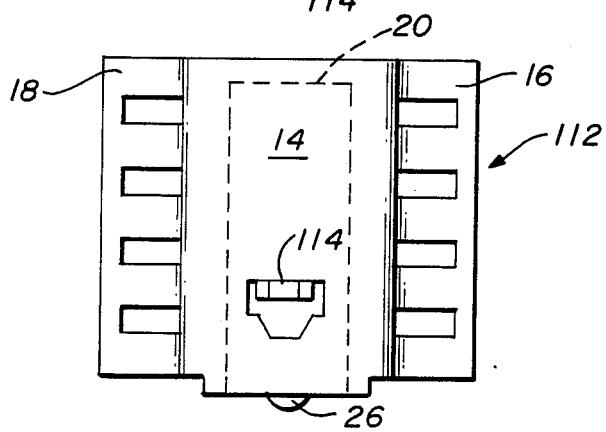
FIG. 4 is a bottom plan view of an alternative embodiment of the invention as shown in FIG. 1 including a locator lug.
Figure 5:
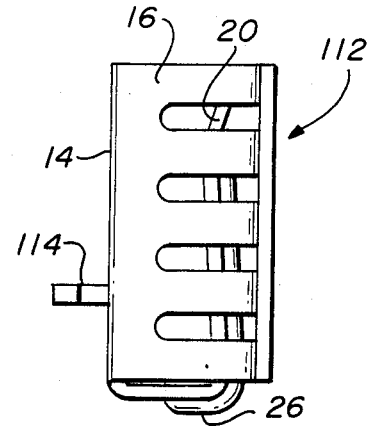
FIG. 5 is a side elevational view of the heat sink of FIG. 4.
Figure 7:
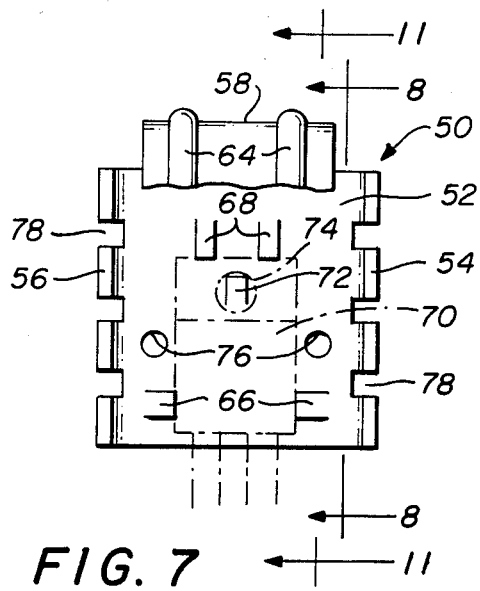
FIG. 7 is a top plan view, partially broken away, of another form of self-securing heat sink constructed in accordance with the invention.

FIGS. 4, 5 and 6 illustrate a modification of heat sink 12 which is generally designated by the reference character 112. In view of the virtual identity of the two heat sinks, the same reference characters will be utilized in FIGS. 4, 5 and 6 as were utilized in FIGS. 1, 2 and 3 with the exception of those parts which are different.

As shown, the heat sink 112 includes a base portion 14, fin portions 16 and 18, and clip portion 20. The clip portion 20 includes the embossment 26 and is otherwise configured as described in connection with the clip portion 20 of the heat sink 12.

Additionally, the heat sink 112 is provided with a locking tab 114 stamped out of the base portion 14. The tab 114 includes a reduced area portion 116 which is of sufficient length to project through a circuit board (not shown) on which the heat sink 112 will be mounted. A head portion 118 of the tab 114 is enlarged compared to the portion 116. When forced through a hole in a circuit board (not shown), the head 118 will secure the heat sink 112 to the circuit board.

In normal use, the heat sink 112 will be in a position wherein the base portion 14 is lying in juxtaposition with the surface of the circuit board. Stated another way, a transistor (now shown) disposed between the clip portion 20 and the base 14 will be disposed in a generally parallel relationship with the surface of the circuit board.

THE EMBODIMENT OF FIGS. 7 THROUGH 11

FIGS. 7–11 illustrate a heat sink generally designated by the reference character 50. The heat sink 50 includes a base portion 52 and a pair of heat radiating fin portions 54 and 56 disposed at an angle relative to the base portion 52.

The heat sink 50 also includes a clip portion 58 that extends from the base portion 52 and is reverse bent thereover. The clip portion 58 includes a medial portion 60 that projects relatively away from the base portion 52 toward the reverse bent portion of the clip portion 58. The clip portion 58 terminates in a free end portion 62 that is bent relatively away from the base portion 52.

The clip portion 58 is provided with a pair of spaced embossments 64 (see FIGS. 7, 9 and 10) which wrap around the reverse bent portion of the clip portion 58 to further increase the rigidity and the resiliency of the clip portion 58.

The base portion 52 is provided with a pair of spaced embossments 66 and a pair of spaced embossments 68 which function to locate a transistor 70 (shown in dash lines) in the heat sink 50. An additional embossment 72, which is similar to the embossment 28 of heat sink 12, is shown disposed in a hole 74 in transistor 70 and functions to releaseably lock the transistor 70 in the heat sink 50.

In addition, the base 52 is provided with a pair of spaced holes 76 which lie outside the area defined by embossments 66 and 68.

As illustrated, the heat radiating fins 54 and 56 of the heat sink 50 are provided with a plurality of slots 78. If desired, the fins 54 and 56 on the heat sink 50 could be configured as illustrated with respect to the fins 16 and 18 of the heat sink 12. That is, the slots 78 could be terminated short of the outermost end of the fins so that the fins 54 and 56 would have a continuous outer edge.

It should also be pointed out that heat sink 50 could be provided with a locking tab 114 as shown in connection with heat sink 112, if desired.

Figure 8:
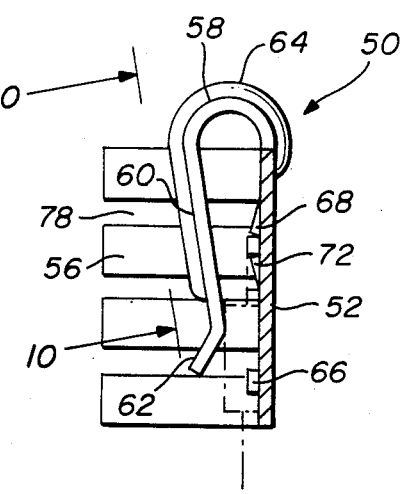
FIG. 8 is a cross-sectional view of the heat sink of FIG. 7 taken generally along line 8—8 of FIG. 7.
Figure 9:
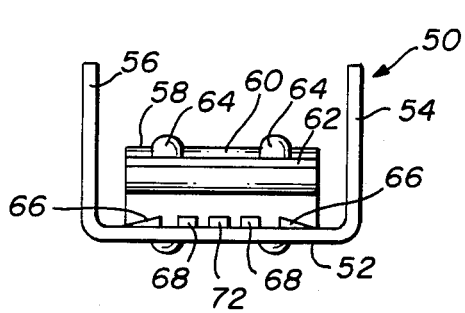
FIG. 9 is an end elevational view of the heat sink of FIG. 7.
Figure 10:
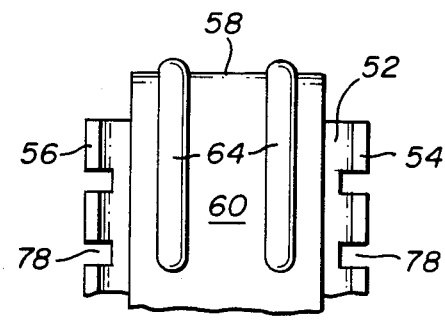
FIG. 10 is a fragmentary top plan view of a portion of the heat sink of FIG. 8 taken generally along line 10—10 of FIG. 8.

As illustrated, the heat sink 50 is designed to be vertically positioned when installed on the circuit board (not shown). In other words, the heat sink will be located with respect to the circuit board as illustrated in FIG. 8.

Figure 11:
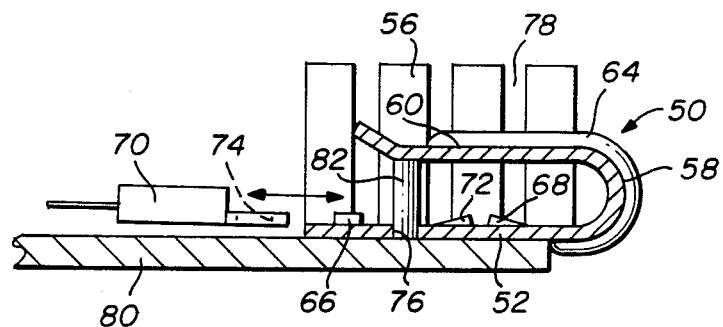
FIG. 11 is a cross-sectional view of the heat sink of FIG. 7 taken generally along line 11—11 of FIG. 7 showing the use of a tool therein for inserting and removing transistors.

Because of the stiffness of the clip portion 58 of the heat sink 50, and the pressure exerted on the transistor 70 thereby, a small tool 80 has been devised having a pair of upstanding pins 82 which project through the holes 76 when in use. As illustrated in FIG. 11, the pins 82 are in engagement with the clip portion 58 holding it relatively away from the base portion 52 so that the transistor 70 may either be inserted therein or removed therefrom without difficulty.

From the foregoing it can be seen that heat sinks 12, 50 and 112 are each capable of securing themselves to a transistor, eliminating the need for threaded fasteners, rivets or the like. Thus, the heat sinks are less expensive, capable of being manufactured by mass production techniques, and easier to install and easier to remove than heat sinks currently in use.

It will be appreciated that the foregoing detailed description is presented by way of example only and that many modifications and changes may be made thereto without departing from the spirit or scope of the invention as defined by the appended claims.

What is claimed is:

1. A self-securing heat sink for transistors and the like, said heat sink comprising a unitary member constructed from malleable material having a high heat transfer coefficient, said unitary member including:
   (a) a base portion;
   (b) at least one heat radiating fin portion disposed at an angle to said base portion; and
   (c) a clip portion extending from and reverse bent over said base portion in spaced relationship to said base portion for receiving a transistor, said clip portion having a free end portion for engaging the transistor; having a medial portion angled toward said base portion; and having first and second spaced apart and generally parallel elongated embossments therein which extend along said clip portion from the intersection thereof with said base portion to a point proximate said free end portion to increase the rigidity and resilience of said clip portion whereby the transistor is engaged by said clip portion to hold the transistor tightly against said base portion.

2. The heat sink of claim 1 including a locking tab punched from said base portion and bent relatively away from said clip portion whereby said tab can be utilized to attach said heat sink to a circuit board.

3. The heat sink of claim 1 wherein said base portion has at least one embossment projecting toward said clip portion, said embossment being arranged to releaseably lock a transistor in said heat sink.

4. The heat sink of claim 3 wherein said base portion has at least one hole therethrough in alignment with said clip portion whereby a tool can be inserted through said hole into engagement with said clip portion to move said clip portion away from said base portion and ease the insertion and removal of a transistor.

5. The heat sink of claim 1 wherein said base portion has a plurality of spaced embossments projecting toward said clip portion for locating the transistor in said heat sink.

6. The heat sink of claim 5 wherein said base portion has a plurality of spaced positioning embossments projecting toward said clip portion to position the transistor in said heat sink.

7. The heat sink of claim 6 wherein said base has a pair of spaced holes therethrough outside the area defined by said positioning embossments in said base and in alignment with said clip portion whereby a tool can be inserted through said holes into engagement with said clip portion to move said clip portion away from said base portion and ease the insertion and removal of a transistor.

8. The heat sink of claim 7 including a tab extending from said base portion away from said clip portion whereby said tab can be utilized to attach said heat sink to a circuit board.

* * * * *